United States Patent [19]
Coles et al.

[11] 3,963,923
[45] June 15, 1976

[54] ION MICROPROBES

[75] Inventors: John Neil Coles, Trumpington; James Victor Percival Long, Haslingfield, both of England

[73] Assignee: National Research Development Corporation, London, England

[22] Filed: Apr. 1, 1975

[21] Appl. No.: 564,084

[30] Foreign Application Priority Data
Apr. 2, 1974 United Kingdom............... 14532/74

[52] U.S. Cl................................. 250/309; 250/399
[51] Int. Cl.² .......................................... H01J 37/26
[58] Field of Search ........... 250/306, 307, 309, 310, 250/311, 396, 397, 398, 399

[56] References Cited
UNITED STATES PATENTS
3,894,233   7/1975   Tamura............................... 250/309

*Primary Examiner*—Craig E. Church
*Attorney, Agent, or Firm*—Cushman, Darby & Cushman

[57] ABSTRACT

An ion microprobe has an ion extraction arrangement formed by a pair of cone-shaped guard electrodes. The guard electrodes are positioned to lie tangentially to each other and to a planar surface from which ions are extracted with their apexes coinciding at the point of extraction. They have equal apex angles of preferably 90°. An aperture is provided at the common apex and electric fields oppositely polarized with respect to each other are provided within each guard electrode for ion and electron beam extraction.

6 Claims, 1 Drawing Figure

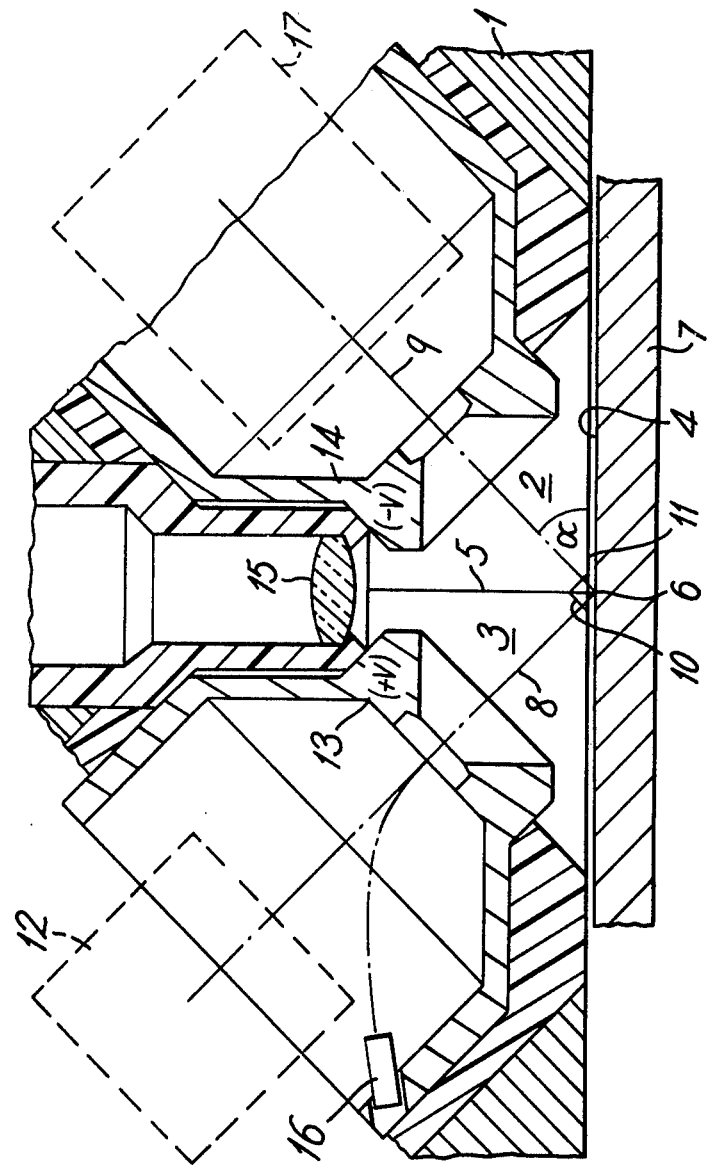

ION MICROPROBES

This invention relates to ion microprobes and is concerned with electron-optical arrangements for extracting ions from a specimen being examined. The extracted ions may be analysed in a mass spectrometer and the resultant signal may be used to form an image of an area of the specimen by scanning such area with the bombarding beam in a conventional manner.

In existing ion microprobes the design of the electronoptics is a compromise between on the one hand the need to shield the bombarding focussed beam from the electrostatic field required for extraction of secondary ions so that off-axis deflection and astigmatism is minimised and on the other hand the requirement of efficient ion extraction. Furthermore existing designs enable only ions of one polarity (either electrons or positively charged particles) to be extracted at any one time.

It is an object of the invention to provide an ion microprobe in which particles of both polarities can be simultaneously and efficiently extracted.

According to the invention an ion microprobe includes an ion extraction arrangement comprising two separate paths for ions and electrons diverging from a common point, a generally cone-shaped or pyramidal guard electrode surrounding each path, the apex angles of which guard electrodes are equal to each other and the apexes coinciding with the said point, said guard electrodes being positioned to lie tangentially to each other and to a planar surface including the said point, an aperture for said paths at the common apex of both guard electrodes, electrical connection between the guard electrodes for enabling the same potential to be applied to both guard electrodes, means for generating electric fields within the guard electrodes oppositely polarised with respect to each other, and means for allowing a focussed ionising beam to strike the said point without suffering astigmatism.

Preferably further generally cone-shaped or pyramidal electrodes are provided inside each guard electrode coaxial with each extraction path the apexes of which further electrodes are directed oppositely to the guard electrodes and in which in operation equal and opposite potential differences relative to the potential of the guard electrodes are applied to the further electrodes, and the further electrodes are so positioned that the electric field pattern relative to each path is similar but of opposite polarity and there are no appreciable off-axis components of electric field along either path. In carrying out the invention the guard electrodes may be formed in a block of metal and material is removed from the block in a plane close to and parallel to the said planar surface so as to enable a specimen under examination to be moved up to the point of bombardment.

From a consideration of the geometrical relationship between the guard electrodes it will be appreciated that the semi-apex angle $\alpha$ of each guard electrode can have a maximum value of 45° and if the angle of the plane containing the two ion paths relative to the plane of the specimen is $\beta$ then $\tan \alpha = \sin \beta$. A particular case of this relationship is when $\alpha$ is 45° in which case $\beta$ is 90° and the plane containing the two ion paths is at right angles to the plane of the specimen and thus includes the normal at the point of bombardment. This particular arrangement is of special value since it enables the bombarding ion beam to be directed along one of the ion extraction paths and the electric field configuration enables the bombarding beam to travel in one axial direction while secondary electrons emitted from the point of bombardment will travel along the same path in the opposite direction. These secondary electrons can be readily separated from the bombarding beam by a suitable magnetic deflecting field. Positive ions emitted from the point of bombardment will travel along the other ion beam path.

It is desirable to be able to view the point of bombardment optically along the normal and this has been difficult to achieve in existing arrangements since any optical lens system of short working distance would disturb the field configuration. However, in embodiments of the invention a viewing arrangement can be incorporated by providing an optical axis along the normal to the point of bombardment. In the particular case where $\alpha$ is 45° and the two guard electrodes meet tangentially along the normal then a small amount of material can be removed along the line of the tangent by drilling a hole and inserting a suitable microscope objective lens in the optical path so formed. The removal of material for viewing does not appreciably disturb the electric field pattern.

In order that the invention may be more fully understood reference will now be made to the drawing accompanying this specification the single FIGURE of which illustrates in section an ion microprobe embodying the invention.

In the FIGURE a block 1 of a suitable metal has bored in it two cones 2 and 3 each having a semi-apex angle $\alpha$ equal to 45°. Cones 2 and 3 are positioned so that their apexes coincide and they both lie tangentially to a planar surface 4. Also they are tangential to each other along a line 5 which extends normally to surface 4 from the point 6 where the apexes of the two cones coincide. A thin layer of material is removed from surface 4 to enable a specimen 7 to be moved up to surface 4 so that the point 6 lies on the surface of the specimen. The geometry of the arrangement is such that the axis 8 of cone 2 and the axis 9 of cone 3 both lie in the same plane as the normal at point 6 and the angle between lines 8 and 9 is 90°. At the apexes of cones 2 and 3 small apertures 10 and 11 will appear to enable ions or electrons to pass to and from point 6 along the paths 8 and 9.

Within cones 2 and 3 there are provided extraction electrodes 13 and 14 which are in the form of metal inserts insulated from the body 1 defining the guard electrodes 2 and 3. Metal inserts 13 and 14 have similar shapes to each other and are preferably cone-shaped or pyramidal. Electrodes 13 and 14 are positioned symmetrically about ion paths 8 and 9 with their apexes directed oppositely to the apexes of guard electrodes 2 and 3. In operation a potential of +V relative to the guard electrodes is applied to extraction electrode 13 and an equal and opposite potential −V is applied to extraction electrode 14. The electric field patterns produced in this way are such that along the ion paths 8 and 9 there are no off-axis electric deflection forces but the field acts to extract positive ions axially along path 9 and negative ions and electrons along path 8. Furthermore owing to the symmetry of the geometry and the balanced electric fields it is possible to drill a hole along the normal 5 and insert in it a microscope objective lens 15 without appreciably disturbing the electric fields. It is thus possible to view the point of bombardment 6 without obstruction while the apparatus is being used.

In operation a focussed positive-ion beam from an ion gun lens 12 is aimed at point 6 and in the region between electrode 13 and point 6 will experience an accelerating field which will have no asymmetric off-axis components and which will not in any way cause astigmatism or off-axis deflection provided the beam is directed along the axis of path 8. Electrons and secondary positive ions emitted from point 6 by the effect of the bombardment will be attracted along either path 8 or path 9 depending on their polarities. Positive ions emitted from point 6 will be attracted along path 9 and be accelerated through the initial region between the point of emission 6 and extraction electrode 14 by an electric field. After passing through extraction electrode 14 any suitable configuration of electrodes 17 can be provided in path 9 depending on the measurements that are desired on the extracted ions. In general the extracted ions will be led to a mass spectrometer. As regards any secondary electrons emitted from point 6 in one mode of operation these will be attracted along path 8 in the opposite direction to the bombarding ion beam and after passing through electrode 13 they can then be separated from the bombarding ion beam by a suitable magnetic deflection field and be directed into a Faraday cup 16.

If desired the point of bombardment can be scanned by applying a suitable scanning field to the bombarding beam. The detected secondary electron current and the positive ion current detected in the mass spectrometer may be used to form scanning images simultaneously on the screens of two separate cathode ray tubes.

While in the arrangement shown in the FIGURE the guard electrodes have a semi-apex angle $\alpha$ of 45° it will be appreciated $\alpha$ can have a smaller value and the electrode assembly can be tilted so that the ion paths 8 and 9 are not co-planar with the normal at point 6. If the plane of the axes 8 and 9 is at an angle $\beta$ relative to the bombarded surface then the maximum value of $\beta$ is given by the relationship $\tan \alpha = \sin \beta$. Furthermore although in the FIGURE the bombarding ion beam is shown as coinciding with one of the extraction ion paths this is not essential and a separate path for the bombarding beam can be provided which may be in a plane other than the plane containing paths 8 and 9.

We claim:
1. An ion microprobe including an ion extraction arrangement comprising two separate paths for ions and electrons diverging from a common point, a generally cone-shaped guard electrode surrounding each path, the apex angles of which guard electrodes are equal to each other and the apexes coinciding with the said point, said guard electrodes being positioned to lie tangentially to each other and to a planar surface including the said point, an aperture for said paths at the common apex of both guard electrodes, electrical connection between the guard electrodes for enabling the same potential to be applied to both guard electrodes, means for generating electric fields within the guard electrodes oppositely polarised with respect to each other, and means for allowing a focussed ionising beam to strike the said point without suffering astigmatism.

2. The ion microprobe as claimed in claim 1 in which further generally cone-shaped electrodes are provided inside each guard electrode coaxial with each extraction path the apexes of which further electrodes are directed oppositely to the guard electrodes and in which in operation equal and opposite potential differences relative to the potential of the guard electrodes are applied to the further electrodes, and the further electrodes being so positioned that the electric field pattern relative to each path is similar but of opposite polarity and there are no appreciable off-axis components of electric field along either path.

3. The ion microprobe as claimed in claim 1 in which the guard electrodes are formed in a block of metal and material is removed from the block in a plane close to and parallel to the said planar surface so as to enable a specimen under examination to be moved up to the point of bombardment.

4. The ion microprobe as claimed in claim 1 in which the means for allowing a focussed ionising beam to strike the said point includes an ion gun for directing an ion beam along one of said paths to be subjected to an axial accelerating field therealong.

5. The ion microprobe as claimed in claim 1 in which optical viewing means are provided along an axis normal to the said point.

6. The ion microprobe as claimed in claim 1 in which the semi-apex angles of the guard electrodes are 45°.

* * * * *